US007271611B2

(12) United States Patent
Farnworth et al.

(10) Patent No.: US 7,271,611 B2
(45) Date of Patent: Sep. 18, 2007

(54) METHOD FOR TESTING SEMICONDUCTOR COMPONENTS USING BONDED ELECTRICAL CONNECTIONS

(75) Inventors: Warren M. Farnworth, Nampa, ID (US); Mark Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/698,678

(22) Filed: Jan. 26, 2007

(65) Prior Publication Data
US 2007/0126459 A1   Jun. 7, 2007

Related U.S. Application Data

(62) Division of application No. 11/057,500, filed on Feb. 14, 2005.

(51) Int. Cl.
*G01R 31/26* (2006.01)
(52) U.S. Cl. .................................................. 324/765
(58) Field of Classification Search ...................... None
See application file for complete search history.

(56) References Cited

U.S. PATENT DOCUMENTS

| | | | |
|---|---|---|---|
| 4,899,921 A | | 2/1990 | Bendat et al. |
| 4,931,726 A | | 6/1990 | Kasukabe et al. |
| 5,289,631 A | * | 3/1994 | Koopman et al. ............ 29/840 |
| 5,389,873 A | * | 2/1995 | Ishii et al. ............... 324/158.1 |
| 5,434,513 A | | 7/1995 | Fuji et al. |
| 5,440,239 A | * | 8/1995 | Zappella et al. ............ 324/757 |
| 5,497,079 A | | 3/1996 | Yamada et al. |
| 5,519,332 A | | 5/1996 | Wood et al. |
| 5,532,610 A | | 7/1996 | Tsujide et al. |
| 5,539,324 A | | 7/1996 | Wood et al. |
| 5,570,032 A | | 10/1996 | Atkins et al. |
| 5,796,264 A | | 8/1998 | Farnworth et al. |
| 5,962,921 A | | 10/1999 | Farnworth et al. |
| 6,107,109 A | | 8/2000 | Akram et al. |
| 6,111,321 A | | 8/2000 | Agarwala |
| 6,119,255 A | | 9/2000 | Akram |
| 6,166,556 A | * | 12/2000 | Wang et al. ................ 324/765 |
| 6,202,298 B1 | | 3/2001 | Smith |
| 6,233,185 B1 | | 5/2001 | Beffa et al. |
| 6,285,203 B1 | | 9/2001 | Akram et al. |
| 6,297,658 B1 | | 10/2001 | Nakata et al. |
| 6,351,134 B2 | | 2/2002 | Leas et al. |

(Continued)

*Primary Examiner*—Ha Tran Nguyen
*Assistant Examiner*—Richard Isla-Rodas
(74) *Attorney, Agent, or Firm*—Stephen A. Gratton

(57) ABSTRACT

A method for testing a semiconductor component includes the steps of bonding an interconnect to the component to form bonded electrical connections, applying test signals through the bonded electrical connections, and then separating the interconnect from the component. The bonding step can be performed using metallurgical bonding, and the separating step can be performed using solder-wettable and solder non-wettable metal layers on the interconnect or the component. During the separating step the solder-wettable layers are dissolved, reducing adhesion of the bonded electrical connections, and permitting separation of the component and interconnect. The interconnect includes interconnect contacts configured for bonding to, and then separation from component contacts on the components. A system includes the interconnect, an alignment system for aligning the substrate to the interconnect, a bonding system for bonding the component to the interconnect, and a heating system for heating the component and the interconnect for separation.

30 Claims, 9 Drawing Sheets

U.S. PATENT DOCUMENTS

| | | |
|---|---|---|
| 6,379,982 B1 | 4/2002 | Ahn et al. |
| 6,384,613 B1 | 5/2002 | Cheng et al. |
| 6,400,169 B1 | 6/2002 | Hembree |
| 6,400,174 B2 | 6/2002 | Akram et al. |
| 6,409,073 B1 * | 6/2002 | Kaskoun et al. ....... 228/180.22 |
| 6,426,904 B2 | 7/2002 | Barth et al. |
| 6,469,530 B1 * | 10/2002 | Johnson et al. ............. 324/754 |
| 6,552,560 B2 | 4/2003 | Melgaard et al. |
| 6,557,244 B1 | 5/2003 | Yang |
| 6,580,283 B1 | 6/2003 | Carbone et al. |
| 6,627,917 B1 | 9/2003 | Fenner et al. |
| 6,640,323 B2 | 10/2003 | Akram |
| 6,677,172 B1 | 1/2004 | Hou et al. |
| 6,737,882 B2 | 5/2004 | Wood et al. |
| 6,753,547 B2 | 6/2004 | Devereaux |
| 6,767,411 B2 * | 7/2004 | Yeh et al. ..................... 148/24 |
| 6,767,819 B2 * | 7/2004 | Lutz ........................... 438/614 |
| 6,784,678 B2 | 8/2004 | Pietzschmann |
| 6,788,085 B2 | 9/2004 | Notohardjono et al. |
| 6,788,094 B2 | 9/2004 | Khandros et al. |
| 6,790,684 B2 | 9/2004 | Ahn et al. |
| 6,893,885 B2 | 5/2005 | Lemmerhirt et al. |
| 7,009,294 B2 | 3/2006 | Hikita et al. |
| 2002/0196047 A1 | 12/2002 | Doherty et al. |
| 2005/0253614 A1 | 11/2005 | Maruyama et al. |
| 2006/0014309 A1 | 1/2006 | Sachdev et al. |

* cited by examiner

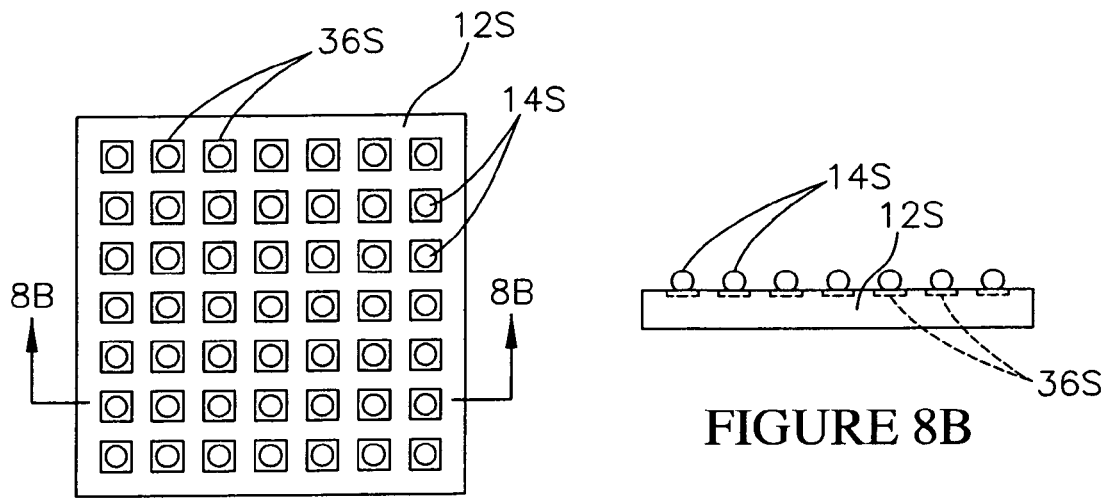
FIGURE 8A
FIGURE 8B
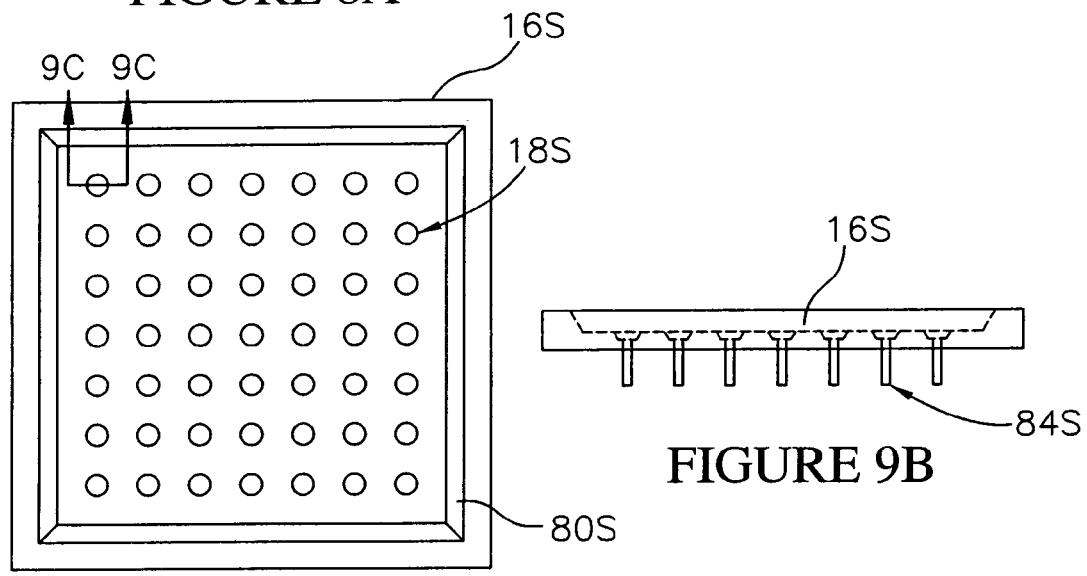
FIGURE 9A
FIGURE 9B
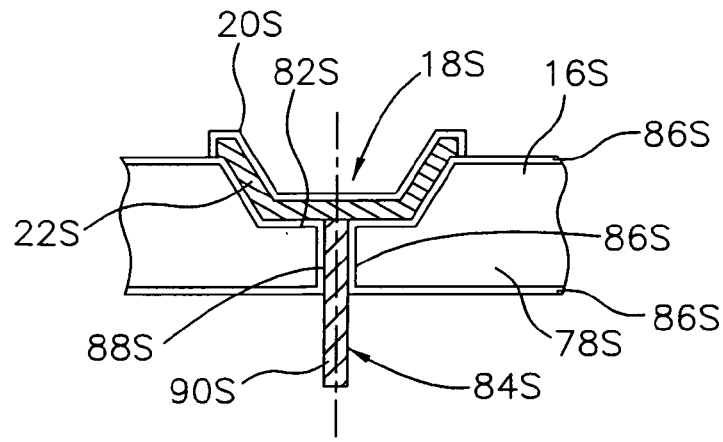
FIGURE 9C

METHOD FOR TESTING SEMICONDUCTOR COMPONENTS USING BONDED ELECTRICAL CONNECTIONS

CROSS REFERENCE TO RELATED APPLICATIONS

This application is a division of Ser. No. 11/057,500 filed Feb. 14, 2005.

This application is related to Ser. No. 11/516,328 filed Sep. 6, 2006, and to Ser. No. 11/516,342 filed Sep. 6, 2006.

FIELD OF THE INVENTION

This invention relates generally to semiconductor manufacture and testing. More particularly, this invention relates to a method, an interconnect and a system for testing semiconductor components.

BACKGROUND OF THE INVENTION

Semiconductor manufacture includes various test procedures wherein the integrated circuits on semiconductor components are evaluated. One such test, known as burn-in, subjects the components to elevated temperatures, while test signals are applied to the integrated circuits contained on the components. Typically, burn-in testing is performed on individual packaged semiconductor components, which are connected in parallel on a burn-in board having individual sockets for the components. The burn-in board is designed for placement in a burn-in oven in electrical communication with test circuitry of a host controller. The test circuitry is designed to apply test signals which electrically "exercise" the integrated circuits. The components being tested are sometimes referred to as the devices under test (DUTs).

Semiconductor components can also be tested using carriers which function as temporary packages for singulated components, such as dice and chip scale packages. For example, burn-in testing of unpackaged dice can be used to certify the dice as known good dice (KGD). U.S. Pat. No. 5,796,264 to Farnworth et al. entitled "Apparatus For Manufacturing Known Good Semiconductor Dice" discloses a system for burn-in testing unpackaged dice. U.S. Pat. No. 5,519,332 to Wood et al., entitled "Carrier For Testing An Unpackaged Semiconductor Die" discloses an exemplary burn-in carrier for singulated dice. Both of these issued patents are assigned to the assignee of the present application, Micron Technology Inc. of Boise Id. This type of carrier includes an interconnect having test contacts configured to make temporary electrical connections with device contacts on the device under test (DUT). Later generation carriers are configured for burn-in testing chip scale packages having device contacts in the form of terminal contacts, such as solder balls, in an area array.

Rather than being performed on individual components, burn-in testing can also be performed at the wafer-level wherein multiple components, such as dice or packages, are contained on a common substrate, such as a semiconductor wafer. Wafer-level testing of semiconductor components has been practiced since at least 1990, as exemplified by U.S. Pat. No. 5,539,324 to Wood et al., entitled "Universal Wafer Carrier For Wafer-level Die Burn-In", also assigned to Micron Technology Inc. The '324 patent discloses a carrier for housing a wafer for burn-in testing having contact tips which electrically engage bond pads on the devices under test (DUTs).

Another wafer-level test apparatus is disclosed in U.S. Pat. No. 5,570,032 to Atkins et al., entitled "Wafer Scale Burn-In Apparatus And Process", also assigned to Micron Technology, Inc. The apparatus in the '032 patent includes a printed circuit board which mates with the wafer under test (WUT), and includes electrically conductive pillars for contacting the bond pads on the devices under test (DUTs). The apparatus also includes heating elements and cooling channels configured to generate the elevated temperatures necessary for burn-in.

A more recent wafer-level burn-in test system is disclosed in U.S. Pat. No. 6,788,094 B2 to Khandros et al., entitled "Wafer-level Burn-in And Test", assigned to FormFactor Inc. of Livermore, Calif. The system in the '094 patent includes a test substrate that mates with the wafer under test (WUT). Metallic spring contact elements on the test substrate or the wafer, make the individual electrical connections with the devices under test (DUTs).

One important aspect of any wafer-level test system are the individual electrical connections with the contacts on the devices under test (DUTs). A single wafer can include a large number of components (e.g., several hundred dice or packages), and each component can include a large number of device contacts (e.g., 50 to 200 bond pads or terminal contacts) having a small size (e.g., 5 mils or less), and a small pitch (e.g., 10 mils or less). Accordingly, the system must make tens of thousand of separate electrical connections with the wafer.

This requires the test contacts of the test system to be accurately aligned with the device contacts on the devices under test (DUTs) prior to making the electrical connections. In addition, the test contacts are preferably capable of making low resistance (ohmic) electrical connections with the device contacts. For making low resistance connections relatively large forces are sometimes used to bias the test contacts against the device contacts. These large biasing forces can damage the wafer, the test contacts and the device contacts. Spring type contacts are particularly vulnerable to bending and distortion under large contact forces.

To make low resistance electrical connections, the test contacts must also contend with native oxide layers (e.g., $AlO_2$) on the device contacts. These oxide layers have a much higher electrical resistance than the underlying metal of the device contacts. Accordingly, some prior art test contacts include structures for penetrating or scrubbing the device contacts. Again, these penetrating structures can require relatively large contact forces, and can damage the device contacts. The test contacts are also subject to oxidation, and attract contaminants, such as dirt and metal flakes, which can add to the contact resistance.

The present invention is directed to a test method using an interconnect configured to make low resistance electrical connections with components having large numbers of small closely spaced contacts. In addition, the interconnect can be configured to test wafer sized components or die sized components.

SUMMARY OF THE INVENTION

In accordance with the present invention, a method, an interconnect and a system for testing semiconductor components are provided.

A wafer-level interconnect is configured for testing multiple components contained on a substrate, such as a semiconductor wafer. A die-level interconnect is configured for testing a singulated semiconductor component, such as a singulated die or a chip scale package.

In either embodiment the interconnect includes interconnect contacts configured for bonding to component contacts and for transmitting test signals to the component. In addition to being configured for bonding to the component contacts, the interconnect contacts are configured for separation from the component contacts following testing. For component contacts made of a solder alloy, the interconnect contacts can comprise solder-wettable outer layers and solder non-wettable inner layers.

The method includes the steps of aligning and placing the interconnect contacts in physical contact with the component contacts, bonding the interconnect contacts to the component contacts to form bonded connections, applying test signals through the bonded connections to the component, and then separating the interconnect from the component.

The aligning step can be performed using an optical or mechanical alignment system, and the bonding step can be performed using a thermal bonding system. Advantageously, the bonded connections do not require externally generated biasing forces such as springs, weights or presses to maintain electrical continuity. In addition, the bonded connections allow handling of the substrate and interconnect as a bonded assembly, which can be easily disassembled following the testing step.

The separating step can be performed by heating the component contacts and the interconnect contacts for a time period sufficient to alloy and dissolve the outer layers of the interconnect contacts into the component contacts. With the outer layers dissolved, the non-wettable inner layers do not adhere to the component contacts, permitting separation of the interconnect from the substrate. Alternately, the component contacts, rather than the interconnect contacts, can include solder-wettable outer layers configured to dissolve into solder interconnect contacts, and solder non-wettable inner layers configured to reduce adhesion with the solder interconnect contacts.

The system includes the component with the component contacts, and the interconnect with the interconnect contacts. The system can also include an optical or mechanical alignment system and a thermal bonding system. In addition, the system can include a heating system for heating and separating the component contacts and the interconnect contacts. For burn-in testing, the system can also include a burn-in board and a burn-in oven.

BRIEF DESCRIPTION OF THE DRAWINGS

FIG. 8A is a schematic bottom view of a singulated semiconductor component;

FIG. 8B is a schematic cross sectional view of the singulated semiconductor component taken along section line 8B-8B of FIG. 8A;

FIG. 9A is a schematic plan view of a socket interconnect configured for bonding, testing and separation from the singulated semiconductor component;

FIG. 9B is a schematic side elevation view of the socket interconnect;

FIG. 9C is an enlarged schematic cross sectional view taken along section line 9C-9C of FIG. 9A illustrating an interconnect contact on the socket interconnect;

DETAILED DESCRIPTION OF THE PREFERRED EMBODIMENTS

As used herein, "semiconductor component" means an electronic element that includes a semiconductor die. Exemplary semiconductor components include bare semiconductor dice and chip scale semiconductor packages, such as BGA (ball grid array), FBGA (fine ball grid array), and EFBGA (enhanced fine ball grid array) packages.

As used herein "wafer-level" means a test procedure conducted on a substrate, such as a semiconductor wafer, containing multiple components.

As used herein "die-sized" means a semiconductor component having an outline about the same size as the outline of a semiconductor die.

As used herein the term "solder-wettable" means the ability of a metal to form a metallurgical bond with a solder alloy. "Solder non-wettable" means the inability of a metal to form a metallurgical bond with a solder alloy.

As used herein "metallurgical bond" means an adhesive connection between metal surfaces resulting from attraction due to heat, pressure or alloying.

As used herein "burn-in" means a test process wherein semiconductor components are electrically exercised, or stressed, at an elevated temperature and voltage environment, for an adequate period of time to cause failure of marginal integrated circuits and devices. In addition, burn-in testing can be conducted using static test signals, or dynamic test signals, such as logical ones and zeroes.

Figure 1:
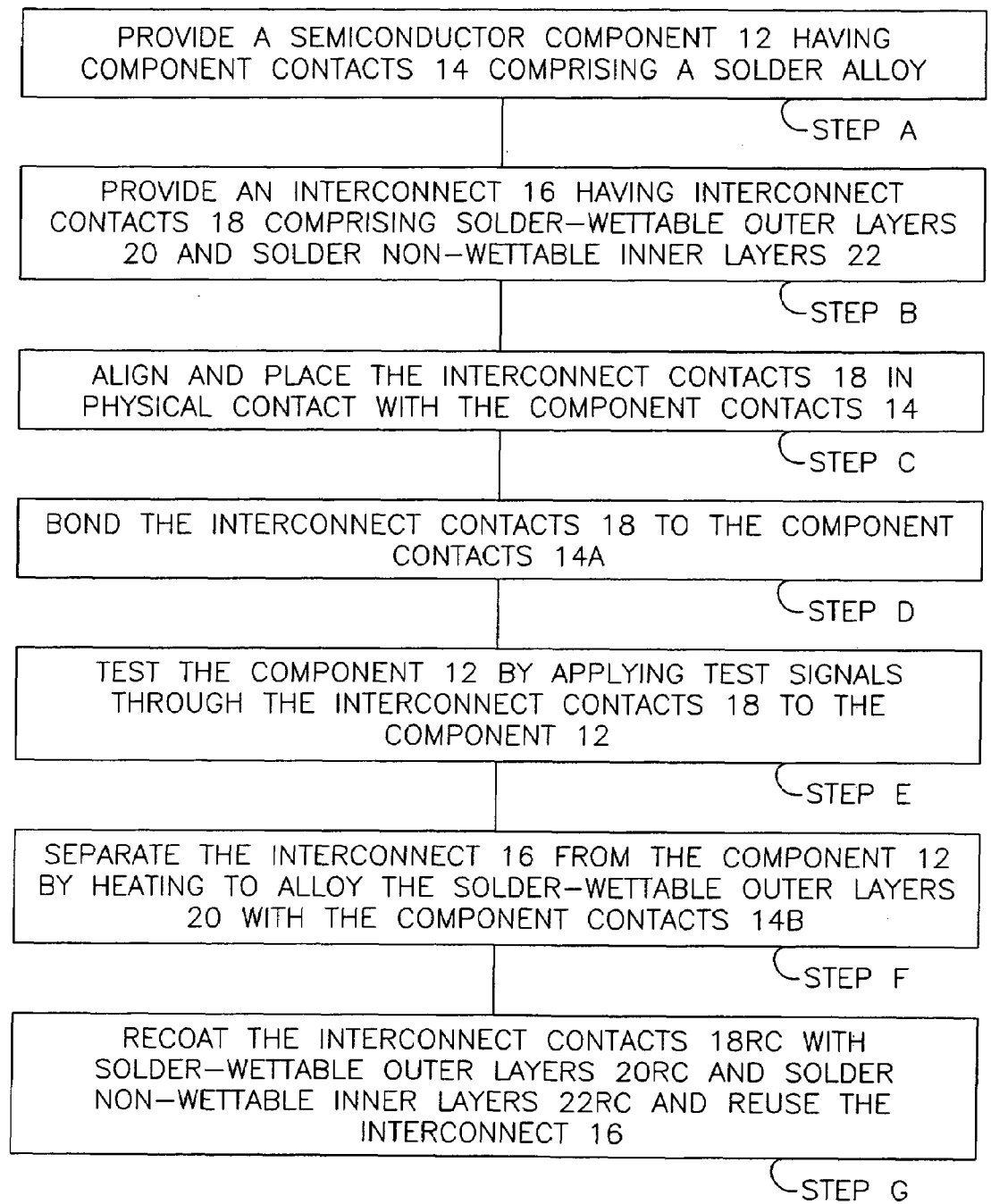
FIG. 1 is a block diagram illustrating steps in the method of the invention.

Referring to FIG. 1, broad steps in the method for testing semiconductor components are illustrated. These steps include:

Step A. Provide a semiconductor component 12 (FIG. 2A) having component contacts 14 (FIG. 2A) comprising a solder alloy.

Figure 3B:
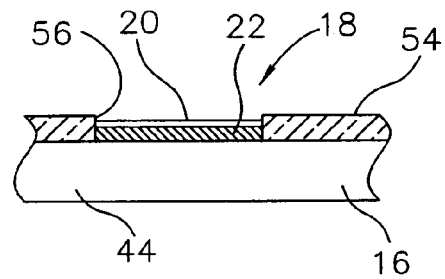
FIG. 3B is an enlarged schematic cross sectional view taken along section line 3B-3B of FIG. 3A illustrating an interconnect contact on the interconnect.

Step B. Provide an interconnect 16 (FIG. 3A) having interconnect contacts 18 (FIG. 3A) comprising solder-wettable outer layers 20 (FIG. 3B) and solder non-wettable inner layers 22 (FIG. 3B).

Figure 5A:
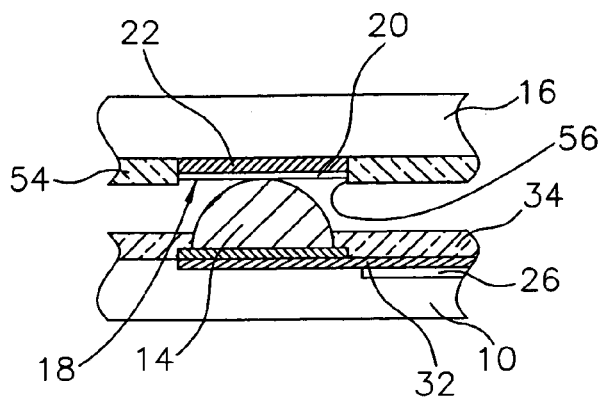
FIG. 5A is an enlarged portion of FIG. 4B taken along line 5A illustrating physical contact between an interconnect contact and a component contact.

Step C. Align and place the interconnect contacts 18 (FIG. 5A) in physical contact with the component contacts 14 (FIG. 5A).

Figure 5B:
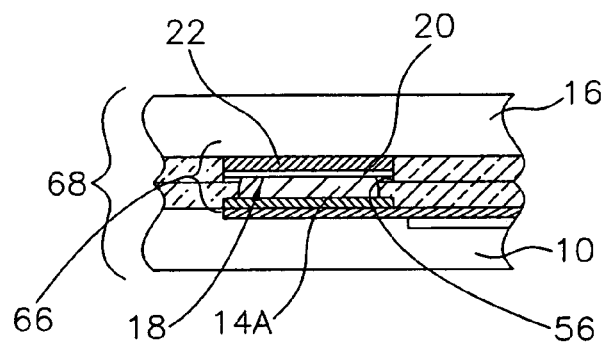
FIG. 5B is an enlarged portion of FIG. 4C taken along line 5B illustrating a bonded connection between an interconnect contact and a component contact.

Step D. Bond the interconnect contacts 18 to the component contacts 14A (FIG. 5B).

Step E. Test the component 12 (FIG. 2A) by applying test signals through the interconnect contacts 18 (FIG. 3A) to the component 12 (FIG. 2A).

Figure 5C:
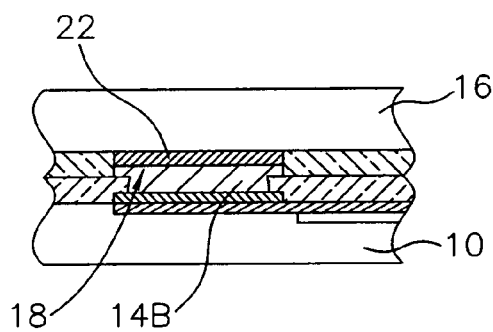
FIG. 5C is an enlarged portion of FIG. 4E taken along line 5C illustrating a component contact alloyed with a wettable outer layer of an interconnect contact.

Step F. Separate the interconnect 16 (FIG. 3A) from the component 12 (FIG. 2A) by heating to alloy the solder-wettable outer layers 20 (FIG. 3B) with the component contacts 14B (FIG. 5C).

Step G. Recoat the interconnect contacts 18 with solder-wettable outer layers 20RC (FIG. 4G) and solder non-wettable inner layers 22RC (FIG. 4G) and reuse the interconnect 16.

Figure 2B:
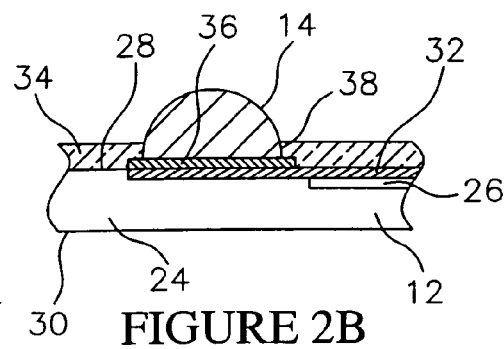
FIG. 2B is an enlarged schematic cross sectional view taken along section line 2B-2B of FIG. 2A illustrating a component contact on a component.
Figure 2A:
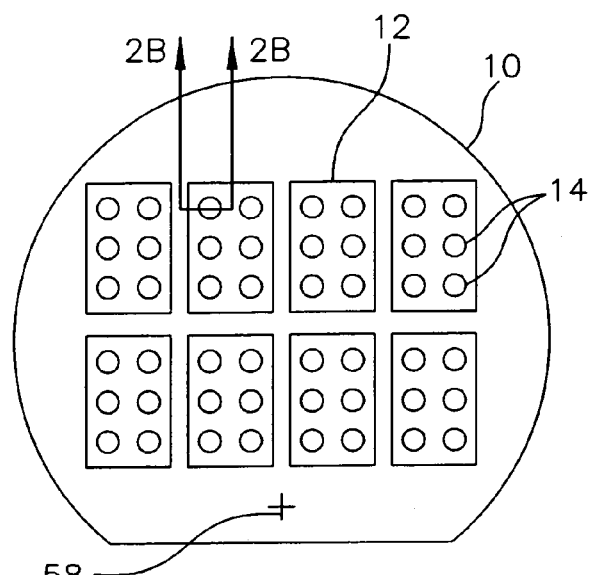
FIG. 2A is a schematic plan view of a substrate containing multiple semiconductor components.

Referring to FIGS. 2A-2C and 3A-3D, a wafer level embodiment is illustrated. As shown in FIG. 2A, multiple components 12 are contained on a substrate 10, such as a semiconductor wafer or portion thereof. The components 12 can comprise chip scale semiconductor packages, and the component contacts 14 can comprise bumps in an area array. For illustrative purposes the substrate 10 has eight components 12, and each component 12 has six component contacts 14 in a grid array. However, in actual practice the substrate 10 could contain several hundred components 12, and each component 12 could have 50-100 or more component contacts 14.

As shown in FIG. 2B, each component 12 includes a semiconductor substrate 24 having a circuit side 28 and a back side 30. Each component 12 also includes a plurality of integrated circuits 26 on the circuit side 28, and conductive traces 32 in electrical communication with the integrated circuits 26. The conductive traces 32 can comprise interlevel conductors or redistribution conductors. In addition, the conductive traces 32 can comprise a highly conductive metal, such as aluminum, chromium, titanium, nickel, iridium, copper, gold, tungsten, silver, platinum, palladium, tantalum, molybdenum, and alloys of these metals.

As also shown in FIG. 2B, the conductive traces 32 can include, or be in electrical communication with contact pads 36. The contact pads 36 can be device bond pads, or can be redistribution pads, formed in a desired pattern, such as an area array. In the illustrative embodiment, the contact pads 36 comprise a solder wettable metal, such as nickel, copper, gold, silver, platinum, palladium, tin, zinc and alloys of these metals.

As also shown in FIG. 2B, each component 12 includes an insulating layer 34 on the circuit side 28, which electrically insulates and protects the conductive traces 32 and the integrated circuits 26. The insulating layer 34 can comprise a die passivation layer, or an additional layer such as a redistribution circuit insulating layer. In addition, the insulating layer 34 can comprise a polymer, such as polyimide, a glass, such as BPSG, or an oxide, such as $SiO_2$.

As also shown in FIG. 2B, the component contacts 14 are formed on the contact pads 36, and project through openings 38 in the insulating layer 34. The component contacts 14 can be formed on the contact pads 36 using any suitable process, such as reflow bonding, screen printing, stenciling, or deposition using a ball bumper or a wire bonder. In addition, the component contacts 14 can comprise any metal used in terminal contacts for semiconductor components. Suitable metals for the component contacts 14 include solder alloys (e.g., Pb/Sn, In/Sn or Pb/Sn/Ag), nickel, copper, beryllium copper, gold, silver, palladium and alloys of these metals. In the illustrative embodiment, the component contacts 14 comprise a solder alloy.

As also shown in FIG. 2B, the component contacts 14 can comprise hemispherical bumps having an outside diameter of from 50 μm to 350 μm. However, the component contacts 14 can have any desired size, and any desired shape, such as balls, domes, pillars or flats. As another example shown in FIG. 2C, alternate embodiment component contacts 14P comprise raised planar pads projecting from an insulating layer 40.

Figure 3C:
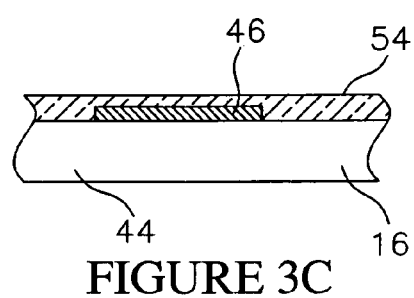
FIG. 3C is an enlarged schematic cross sectional view taken along section line 3C-3C of FIG. 3A illustrating a conductor on the interconnect.
Figure 3A:
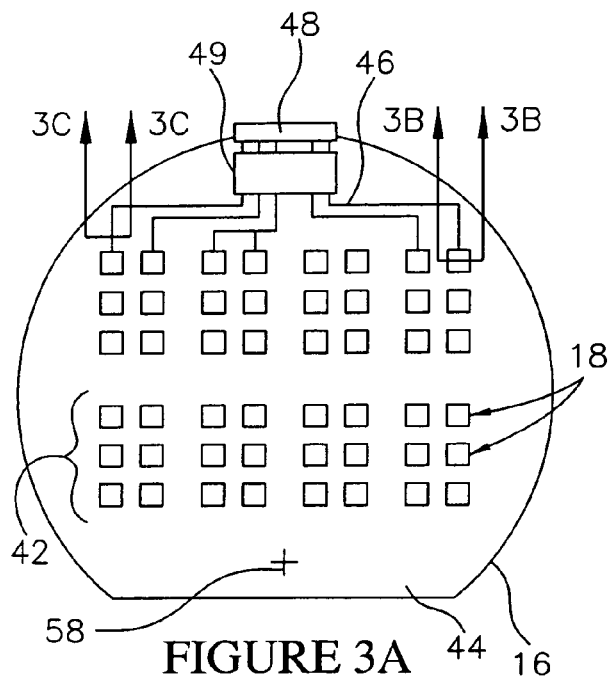
FIG. 3A is a schematic plan view of an interconnect configured for bonding, testing and separation from the substrate of FIG. 2A.

Referring to FIGS. 3A-3C, the interconnect 16 is shown separately. The interconnect 16 is configured for bonding to the substrate 10 (FIG. 2A), and for separation from the substrate 10 (FIG. 2A) following testing. In addition, the interconnect 16 is configured to provide separate electrical paths for transmitting test signals to the components 12 (FIG. 2A). Still further, following separation, the interconnect 16 is configured for recoating and testing of a second substrate, substantially similar to the substrate 10 (FIG. 2A).

As shown in FIG. 3A, the interconnect 16 includes an interconnect substrate 44. In the illustrative embodiment, the interconnect substrate 44 is generally circular, with a peripheral shape about the same as that of the substrate 10. Suitable materials for the interconnect substrate 44 include semiconductor materials, such as silicon, glass filled polymers, such as "FR-4", flexible polymer materials, such as polyimide, and ceramics.

As shown in FIG. 3B, the interconnect contacts 18 comprise planar pads formed on a circuit side of the interconnect substrate 44 in a plurality of separate patterns 42 (FIG. 3A). Each pattern 42 (FIG. 3A) of interconnect contacts 18 matches a pattern and pitch of component contacts 14 (FIG. 2A) for a single component 12 (FIG. 2A) on the substrate 10 (FIG. 2A). The patterns 42 (FIG. 3A) collectively match all of the patterns of component contacts 14 (FIG. 2A) on the substrate 10 (FIG. 2A). In the illustrative embodiment, each interconnect contact 18 (FIG. 3A) has a generally square peripheral configuration, but any polygonal, circular or curved peripheral shape can be utilized. Further, each interconnect contact 18 (FIG. 3A) has a peripheral size, which is about the same, or slightly larger than, the diameter of a component contact 14 (FIG. 2A). However, the interconnect contacts 18 (FIG. 3A) can have any peripheral shape and for alignment purposes can be substantially larger than the component contacts 14 (FIG. 2A).

As shown in FIG. 3A, the interconnect contacts 18 are in electrical communication with a plurality of conductors 46 formed on a circuit side of the interconnect substrate 44. Further, the conductors 46 are in electrical communication with an electrical connector 48, such as an edge connector located proximate to a peripheral edge of the interconnect substrate 44. The electrical connector 48 is configured for electrical communication with a mating receptacle 70 (FIG. 4D) on a burn-in board 50 (FIG. 4D) in electrical communication with a testing circuitry 52 (FIG. 4D). The electrical connector 48 can comprise an element formed directly on the interconnect 16, or a separate element such as a flex circuit, attached to the interconnect 16. Alternately, rather than a single electrical connector 48 each conductor 46 can be in electrical communication with a terminal contact configured for electrical connection to the testing circuitry 52 (FIG. 4D). In addition, the conductors 46, rather than being surface elements, can comprise internal conductors such as metal filled vias.

The interconnect 16 can also include one or more on-board semiconductor components 49, such as semiconductor dice or packages, in electrical communication with the conductors 46 and the interconnect contacts 18. The on-board semiconductor components 49 can be configured to perform a desired function such as testing, control, analysis, memory or timing.

As shown in FIG. 3B, the interconnect 16 also includes an insulating layer 54 having openings 56 wherein the interconnect contacts 18 are located. The insulating layer 54 can comprise a polymer, a glass, or an oxide as previously described for the insulating layer 34 (FIG. 2B). As shown in FIG. 3C, the insulating layer 54 can also cover and insulate the conductors 46.

As shown in FIG. 3B, each interconnect contact 18 includes a solder-wettable outer layer 20 (first layer), and a solder non-wettable inner layer 22 (second layer). The solder-wettable outer layers 20 are formed of a first metal which readily alloys with the component contacts 14 (FIG. 2A). The solder non-wettable inner layers 22 are formed of a second metal which does not readily alloy or bond with the component contacts 14 (FIG. 2A). For example, the solder-wettable outer layers 20 can comprise palladium, silver, nickel, copper, gold, platinum, tin, zinc or alloys of these metals. The solder non-wettable inner layers 22 can comprise aluminum or titanium.

Figure 2C:
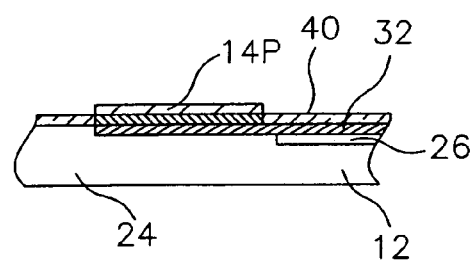
FIG. 2C is an enlarged schematic cross sectional view equivalent to FIG. 2B illustrating an alternate embodiment component contact.
Figure 3D:
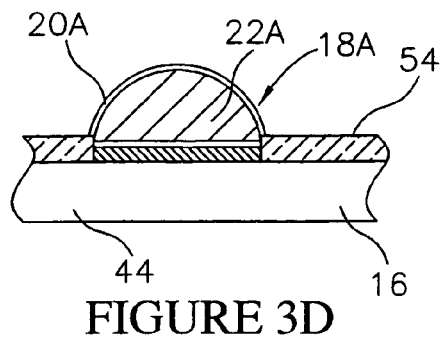
FIG. 3D is an enlarged schematic cross sectional view equivalent to FIG. 3B illustrating an alternate embodiment interconnect contact.

As shown in FIG. 3D, an alternate embodiment bumped interconnect contact 18A comprises a solder non-wettable inner bump 22A covered with a solder-wettable outer layer 20A. The bumped interconnect contact 18A is particularly suited for use with planar component contact 14P (FIG. 2C).

Referring to FIGS. 4A-4F, steps in the method of the invention are illustrated schematically. As indicated on the right hand side of FIGS. 4A-4F, each figure corresponds to one or more of the steps outlined in FIG. 1.

Figure 4A:
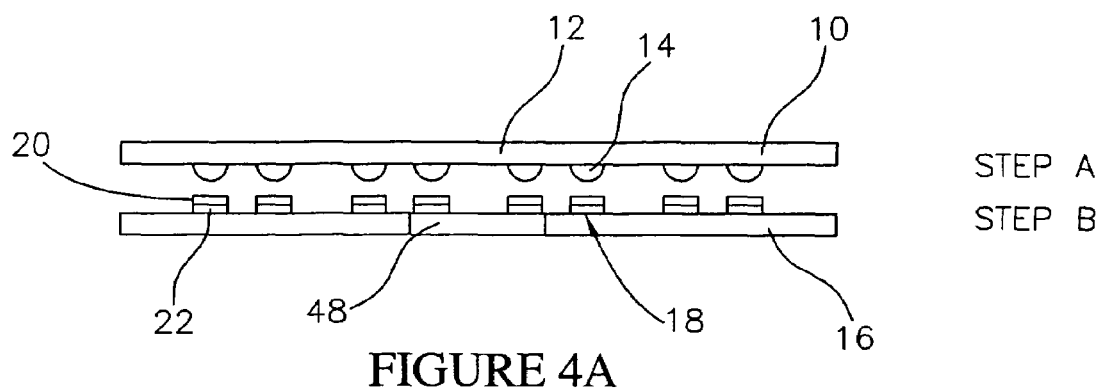
FIGS. 4A-4F are schematic cross sectional views illustrating steps in the method of the invention.

Initially, as shown in FIG. 4A, the substrate 10 is provided (Step A), and the interconnect 16 is provided (Step B). The substrate 10 includes the components 12 having the component contacts 14 in area areas as previously described. The interconnect 16 includes the interconnect contacts 18 having solder-wettable outer layers 20 and solder non-wettable inner layers 22 as previously described.

Figure 4B:
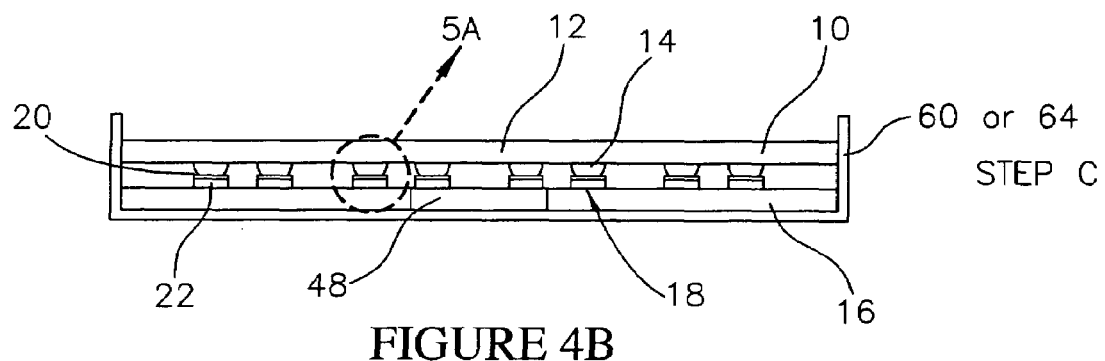

Next, as shown in FIG. 4B, the substrate 10 and the interconnect 16 are aligned, and the component contacts 14 are placed in physical contact with the interconnect contacts 18 (Step C). As shown in FIG. 5A, the component contacts 14 can be sized to fit into the openings 56 in the insulating layer 54. As also shown in FIG. 5A, the tips of the component contacts 14 physically contact the planar surfaces of the interconnect contacts 18.

Referring again to FIG. 4B, the alignment step can be performed using either an optical or mechanical alignment system 60. For example, one commercial wafer alignment system is the "MA6" contact aligner manufactured by Karl Suss of Germany. In addition, the substrate 10 and the interconnect 16 can include one or more alignment marks 58 (FIGS. 2A and 3A) to facilitate optical alignment. Mechanical alignment systems are described in U.S. Pat. No. 6,400,174 B2 to Akram et al. entitled "Test System Having Alignment Member For Aligning Semiconductor Components", which is incorporated herein by reference.

Figure 4C:
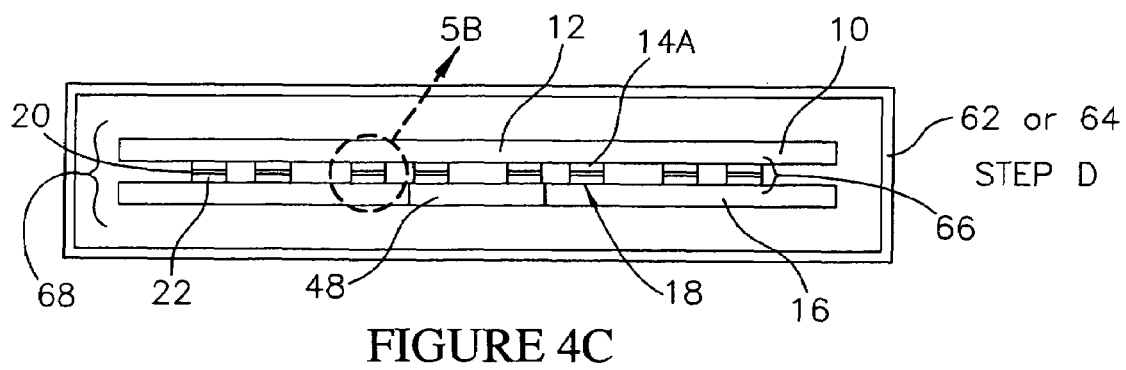
Figure 4D:
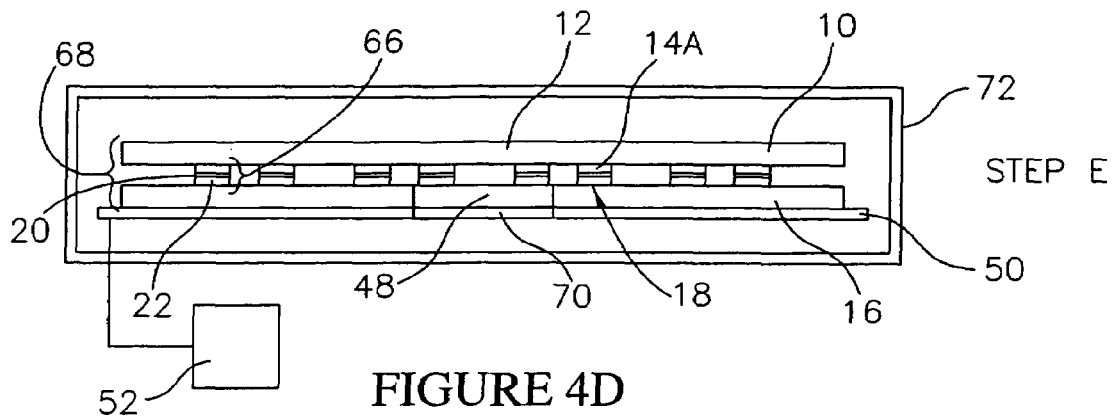

Following the alignment step, and as shown in FIG. 4C, the interconnect contacts 18 are bonded to the component contacts 14 (Step D). The bonding step can be performed using a thermal bonding system 62, such as an oven, configured to heat the substrate 10 and the interconnect 16 to an elevated temperature (e.g., 100 to 200° C.) for a selected time period (e.g., seconds to minutes). Alternately, as will be further explained, the bonding step can be performed using a heating element such as a thermode.

As shown in FIG. 5B, the bonding step is preferably performed such that the solder-wettable outer layers 20 of the interconnect contacts 18 maintain their shape and adhesion with the solder non-wettable inner layers 22. However, during the bonding step, the component contacts 14 (FIG. 5A) can deform and metallurgically bond to the wettable outer layers 20. In FIGS. 4C and 5B, the deformed component contacts are indicated by reference numeral 14A. The parameters of the bonding step (e.g., time, temperature) are dependent on the materials used for the component contacts 14 (FIG. 5A) and the interconnect contacts 18.

The bonded component contacts 14A and interconnect contacts 18 provide low-resistance, metallurgically-bonded electrical connections 66 (FIG. 5B) between the components 12 (FIG. 4C) and the interconnect 16. In addition, the bonded substrate 10 (FIG. 4C) and interconnect 16 (FIG. 4C) form a bonded test assembly 68 (FIG. 4C). The bonded electrical connections 66 (FIG. 5B) have an adhesive force sufficient to maintain the alignment and integrity of the bonded test assembly 68 (FIG. 4C) during handling and testing. In addition, the bonded electrical connections 66 (FIG. 5B) do not require external biasing forces from mechanical devices such as springs, weights or presses, as with conventional biased electrical connections such as probe needles. Further, the bonded electrical connections 66 (FIG. 5B) have a lower contact resistance that biased electrical connections.

As another alternative, a wafer bonder 64 (FIGS. 4B and 4C) can be used to perform both the aligning step and the bonding step. The wafer bonder 64 is configured to align and place the substrate 10 and the interconnect 16 together substantially as shown in FIG. 4B. The wafer bonder 64 is also configured to heat the substrate 10 and the interconnect 16 to an elevated temperature (e.g., 100° to 200° C.) for a selected time period (e.g., seconds to minutes), and with a selected compressive force (e.g., 100-200 N) to form the bonded electrical connections 66 (FIG. 5B). One suitable thermo compression wafer bonder 64 is the "ELECTRONIC VISIONS EV 501 Manual Wafer Bonder", manufactured by Electronic Visions Group of Sharding, Austria.

Following the bonding step, and as shown in FIG. 4D, a testing step (Step E) is performed, in which test signals are applied through the bonded electrical connections 66 to the components 12. In the illustrative embodiment, burn-in testing is performed. Alternately, rather than burn-in testing, functionality testing or parametric testing can be performed. In general, functionality testing tests the functionality of the components (e.g., gross functionality, opens, shorts) and parametric testing evaluates electrical characteristics of the components (e.g., speed, grade). In addition to evaluating the components, the testing step maps the substrate 10 by identifying the unique locations of the components 12 on the substrate 10.

As also shown in FIG. 4D, for burn-in testing, the bonded assembly 68 can be placed on a burn-in board 50 in electrical communication with the testing circuitry 52. In addition, the burn-in board 50 can be placed in a burn-in oven 72 configured to heat the components 12 to elevated temperatures (e.g., 100° C.) for an extended time period (e.g., minutes to hours).

As also shown in FIG. 4D, the burn-in board 50 can include an electrical receptacle 70 configured to receive the electrical connector 48. The connection between the electrical receptacle 70 and the electrical connector 48 places the bonded electrical connections 66 in electrical communication with the testing circuitry 52. The testing circuitry 52 is configured to apply the required test signals to the components 10 and to analyze the resultant signals from the components 10. Suitable testing circuitry 52 is commercially available from manufacturers such as Advantest Corp., Tokyo, Japan; Aehr Test Systems, Fremont, Calif.; and Motorola Corp., Schaumberg, Ill.

Figure 4E:
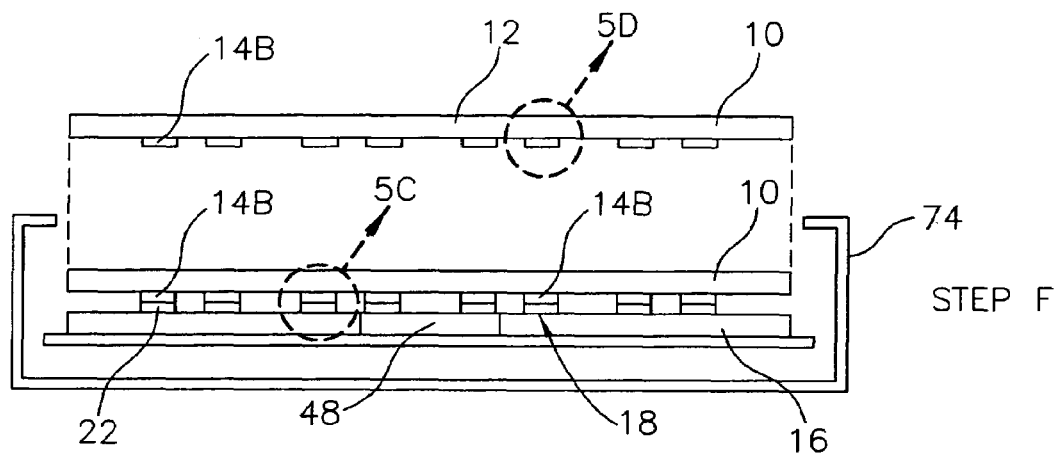

Following the testing step, and as shown in FIG. 4E, a separating step (Step F) is performed, in which the substrate 10 is separated from the interconnect 16. The separating step can be performed using a heating system 74, such as a reflow oven, configured to heat the bonded connections 66 (FIG. 5B) to a temperature, and for a time period sufficient to alloy the solder-wettable outer layers 20 (FIG. 5B) of the interconnect contacts 18 into the component contacts 14. During the separating step the solder-wettable outer layers 20 (FIG. 5B) dissolve (i.e., ablate) as the solder-wettable metal is drawn completely into the metal of the component contacts 14. The component contacts 14 thus include a base metal, and the solder-wettable metal alloyed into the base metal.

In FIGS. 4E and 5C, the alloyed component contacts are designated with reference numeral 14B. The parameters of the separating step (e.g., time, temperature) are dependent on the materials used for the component contacts 14 (FIG. 5A) and the interconnect contacts 18. By way of example, for component contacts 14 (FIG. 5A) made of a tin-lead solder alloy, and interconnect contacts 18 having solder-wettable outer layers 20 (FIG. 5A) made of palladium, during the separating step, the bonded connections 66 (FIG. 5B) can be heated to a temperature of about 220° C. for a time period of about 10 seconds.

Figure 5D:
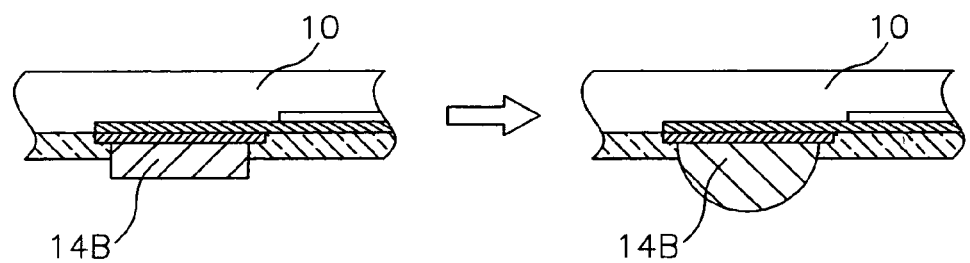
FIG. 5D is an enlarged portion of FIG. 4E taken along line 5D illustrating a component contact following reflow.

With the solder-wettable outer layers 20 (FIG. 5B) alloyed into the component contacts 14B (FIG. 5C), the component contacts 14B (FIG. 5C) do not adhere to the non-wettable inner layers 22 (FIG. 5C) of the interconnect contacts 18 (FIG. 5C). This allows the substrate 10 (FIG. 4E) to be separated from the interconnect 16 (FIG. 4E) using a suitable tool, such as a vacuum pick up device. Advantageously, the component contacts 14 (FIG. 5A) can be small, thin structures to facilitate stacking of multiple components 12 (FIG. 2A) following singulation thereof. In addition, as shown in FIG. 5D, following the separation step, the component contacts 14B can be reflowed back into a hemispherical shape.

Figure 4F:
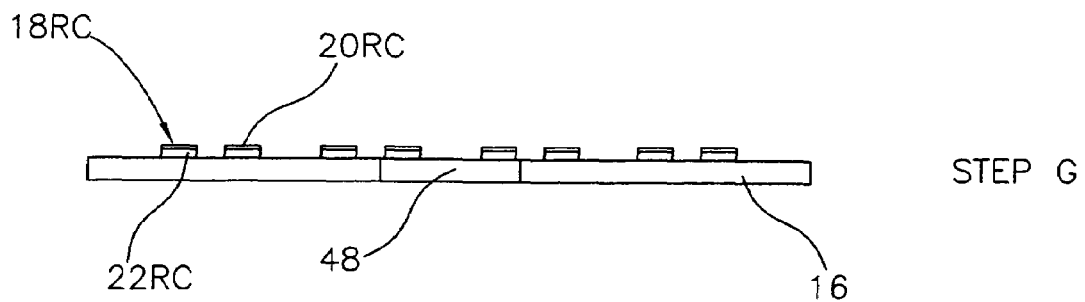

Following the separating step, and as shown in FIG. 4F, the interconnect contacts 18 (FIG. 4E) can be recoated, such that the interconnect 16 can be reused for testing other semiconductor components. In FIG. 4F, the recoated interconnect contacts are designated 18RC, the recoated solder-wettable outer layers are designated 20RC and the recoated solder non-wettable inner layers are designated 22RC. Recoating of the interconnect contacts 18 (FIG. 4E) can be performed using processes known in the art, including plating processes such as electroless deposition.

Figure 6A:
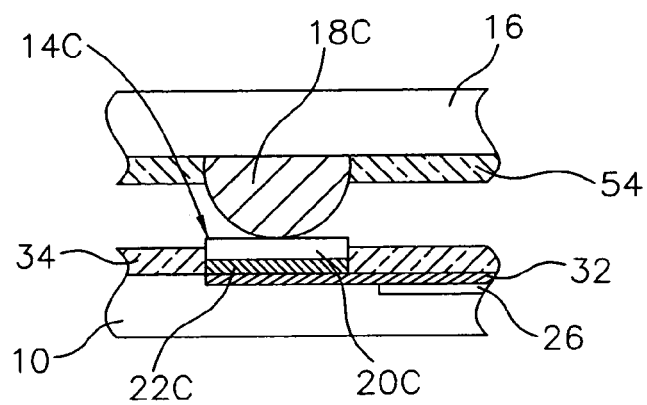
FIG. 6A is an enlarged schematic cross sectional view equivalent to FIG. 5A illustrating an alternate embodiment component contact physically contacting an alternate embodiment interconnect contact.
Figure 6B:
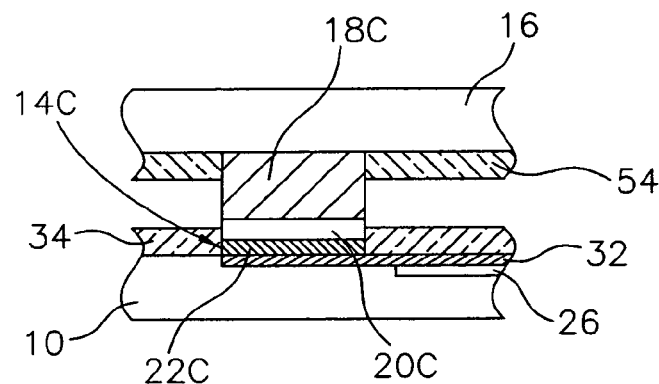
FIG. 6B is an enlarged schematic cross sectional view equivalent to FIG. 5B illustrating the alternate embodiment component contact bonded to the alternate embodiment interconnect contact.
Figure 6C:
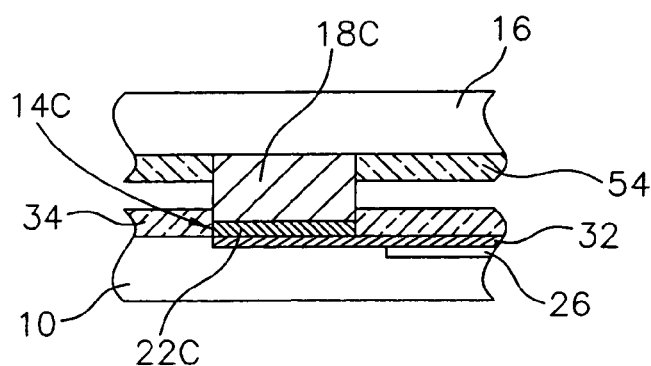
FIG. 6C is an enlarged schematic cross sectional view equivalent to FIG. 5C illustrating the alternate embodiment component contact alloyed with the alternate embodiment interconnect contact.

Referring to FIGS. 6A-6C, steps in an alternate embodiment of the method illustrated in FIGS. 4A-4F are illustrated. In the alternate embodiment, the component contacts 14C comprise planar pads having solder-wettable outer layers 20C and solder non-wettable inner layers 22C. In addition, the interconnect contacts 18C comprise bumps formed of a solder alloy that alloys with the solder-wettable outer layers 20C, but does not alloy with the solder non-wettable inner layers 22C of the component contacts 14C.

In FIG. 6A, the component contacts 14C and the interconnect contacts 18C are placed in physical contact, substantially as previously described for the interconnect contacts 18 (FIG. 5A) and the component contacts 14 (FIG. 5A). In FIG. 6B, the interconnect contacts 18C are metallurgically bonded to the component contacts 14C using a process such as heating or pressure, substantially as previously described for the component contacts 14A (FIG. 5B) and interconnect contacts 18 (FIG. 5B). In FIG. 6C, the solder-wettable outer layers 20C (FIG. 6B) alloy with the interconnect contacts 18C, such that adhesion with the solder non-wettable inner layers 22C is reduced, allowing separation of the substrate 10 and the interconnect 16.

Figure 7:
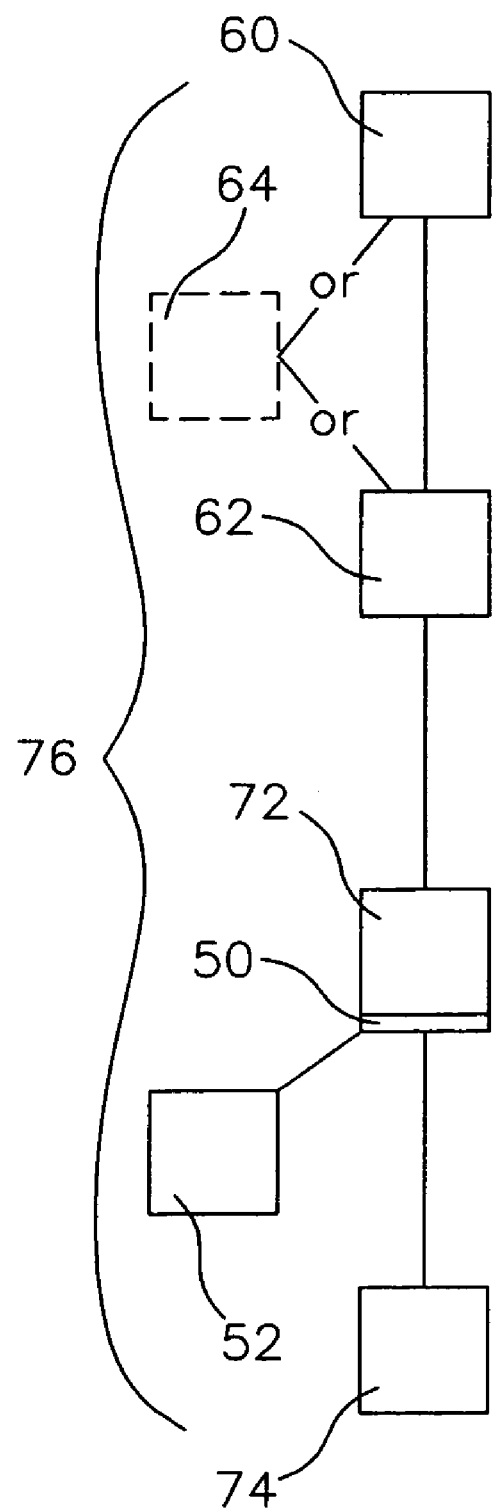
FIG. 7 is a schematic diagram of a system constructed in accordance with the invention.

Referring to FIG. 7, a system 76 for performing the method of the invention is illustrated. The system 76 includes the substrate 10 (FIG. 2A) containing the components 12 (FIG. 2A) with the component contacts 14 (FIG. 2A), and the interconnect 16 (FIG. 3A) with the interconnect contacts 18 (FIG. 3A). Alternately, the system 76 can include the substrate 10 (FIG. 6A) containing the components 12 (FIG. 6A) with the component contacts 14C (FIG. 6A), and the interconnect 16 (FIG. 6A) with the interconnect contacts 18C (FIG. 6A).

As also shown in FIG. 7, the system 76 also includes an optical or mechanical alignment system 60, and a metallurgical bonding system 62 for bonding the component contacts 14A (FIG. 5B) to the interconnect contacts 18 (FIG. 5B) to form the bonded connections 66 (FIG. 5B) and the bonded assembly 68 (FIG. 5B). Alternately, the system 76 can include a thermo compression wafer bonder 64 for aligning and bonding the component contacts 14A (FIG. 5B) and the interconnect contacts 18 (FIG. 5B) to form the bonded connections 66 (FIG. 5B) and the bonded assembly 68 (FIG. 5B). For burn-in testing, the system 76 can also include a burn-in board 50 in electrical communication with the testing circuitry 52 and a burn-in oven 72. In addition, the system 76 can include the heating system 74 for forming the alloyed component contacts 14B (FIG. 5C) and separating the substrate 10 (FIG. 5C) from the interconnect 16 (FIG. 5C).

Referring to FIGS. 8A-8B, 9A-9C, and 10A-10C a die-level embodiment is illustrated. In FIGS. 8A and 8B, a singulated semiconductor component 12S in the form of a singulated die or a chip scale package is illustrated. The component 12S includes bumped component contacts 14S mounted on contact pads 36S in electrical communication with the integrated circuits contained on the component 12S. The component contacts 14S are the terminal contacts for the component 12S and can comprise solder balls in an area array, such as a ball grid array. Alternately, rather than balls, the component contacts 14S can comprise solder bumps, domes, pillars, pins, cones or truncated spheres. In addition, the component contacts 14S can be made of solder alloys that are known in the art.

In FIGS. 9A-9C, a socket interconnect 16S configured for testing the singulated semiconductor component 12S is illustrated. The socket interconnect 16S includes an interconnect substrate 78S (FIG. 9C) made of a material such as silicon, ceramic or photosensitive glass.

Figure 10A:
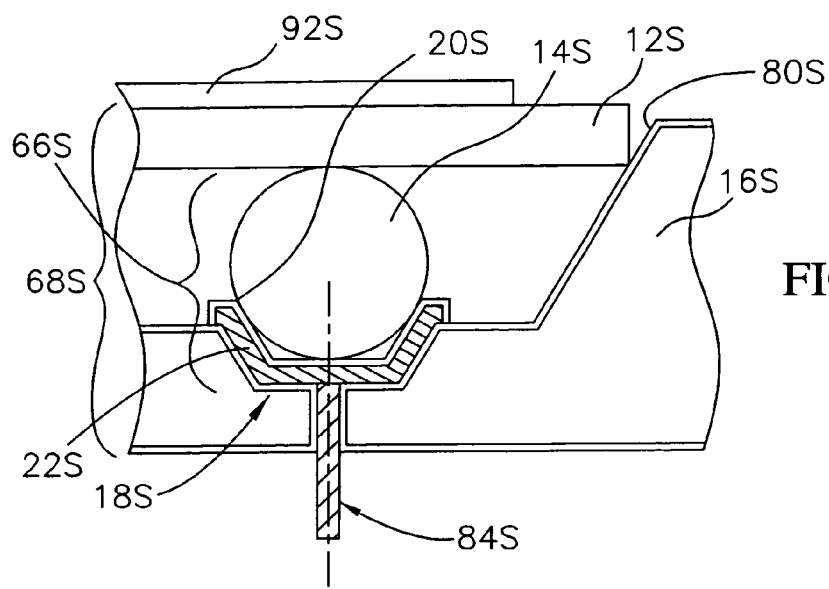
FIG. 10A is an enlarged schematic cross sectional view illustrating a bonding step using the socket interconnect.

The socket interconnect 16S also includes an array of interconnect contacts 18S in the interconnect substrate 78S configured to electrically engage the component contacts 14S (FIG. 8B) on the component 12S (FIG. 8B). The interconnect contacts 18S comprise circular pockets 82S (FIG. 9C) sized and shaped to retain the component contacts 14S (FIG. 8B) substantially as shown in FIG. 10A. In addition, the pocket 82S (FIG. 9C) for each interconnect contact 18S includes a solder wettable outer layer 20S (FIG. 9C), and a solder non-wettable inner layer 22S (FIG. 9C), substantially as previously described for interconnect contacts 18 (FIG. 3B).

Figure 10B:
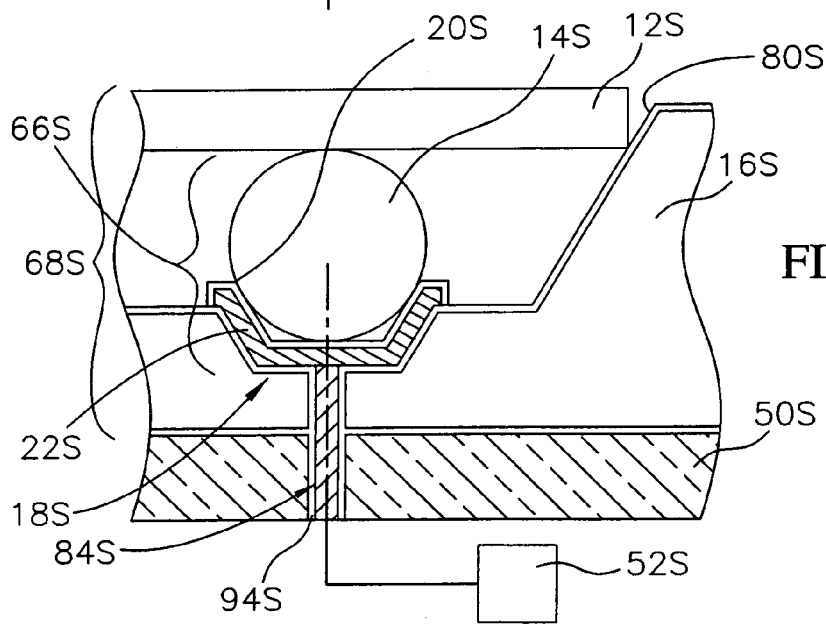
FIG. 10B is an enlarged schematic cross sectional view illustrating a testing step using the socket interconnect.

Each interconnect contact 18S (FIG. 9C) also includes a terminal contact 84S (FIG. 9C) configured for electrical communication with a burn in board 50S (FIG. 10B). Each terminal contact 84S (FIG. 9C) includes a via portion 88S (FIG. 9C) in the interconnect substrate 78S (FIG. 9C) and an exposed pin portion 90S (FIG. 9C) projecting from the interconnect substrate 78S (FIG. 9C).

The socket interconnect 16S (FIG. 9A) also includes an alignment member 80S (FIG. 9A) configured to align the component 12S (FIG. 8B) and the component contacts 14S (FIG. 8B) with the interconnect contacts 18S. The alignment member 80S (FIG. 9A) comprises a peripheral sloped surface having an outline that substantially matches that of the component 12S (FIG. 8B). The alignment member 80S (FIG. 9A) can comprise an etched feature of the interconnect substrate 78S substantially as shown, but can also be a separate member attached to the interconnect substrate 78S.

The socket interconnect 16S (FIG. 9A) also includes electrically insulating layers 86S (FIG. 9C) which electrically insulate the interconnect contacts 18S (FIG. 9C) and the terminal contacts 84S (FIG. 9C). The insulating layers 86S (FIG. 9C) can comprise insulating polymers or oxides formed on the interconnect substrate 78S using a deposition or growth process.

The socket interconnect 16S (FIG. 9A) can be fabricated using techniques that are known in the art. For example, with the interconnect substrate 78S comprising silicon, an anisotropic etching process using a wet etchant such as KOH, can be used to etch the alignment member 80S (FIG. 9A). An anisotropic etching process can also be used to etch the pockets 82S (FIG. 9C) for the interconnect contacts 18S (FIG. 9C). The solder wettable outer layer 20S (FIG. 9C) and the solder non-wettable inner layer 22S (FIG. 9C) for the interconnect contacts 18S (FIG. 9C) can be formed using electroless deposition substantially as previously described. The terminal contacts 84S (FIG. 9C) can be formed by laser machining or etching vias in the interconnect substrate 78S (FIG. 9C), filling the vias with a metal, and then etching the interconnect substrate 78S (FIG. 9C) from the back side to expose the pin portions 90S (FIG. 9C).

U.S. Pat. No. 6,285,203 B1 to Akram et al. entitled "Test System Having Alignment Member For Aligning Semiconductor Components", which is incorporated herein by reference, describes additional processes for forming the alignment member 80S (FIG. 9A).

U.S. Pat. No. 5,962,921 to Farnworth et al. entitled "Interconnect Having Recessed Contact Members With Penetrating Blades For Testing Semiconductor Dice And Packages With Contact Bumps", which is incorporated herein by reference, describes additional processes for forming the interconnect contacts 18S (FIG. 9C).

U.S. Pat. No. 6,107,109 to Akram et al. entitled "Method For Fabricating A Semiconductor Interconnect With Laser Machined Electrical Paths Though Substrate", which is incorporated herein by reference, describes processes for forming the via portions 88S (FIG. 9C) of the terminal contacts 84S (FIG. 9C).

Figure 10C:
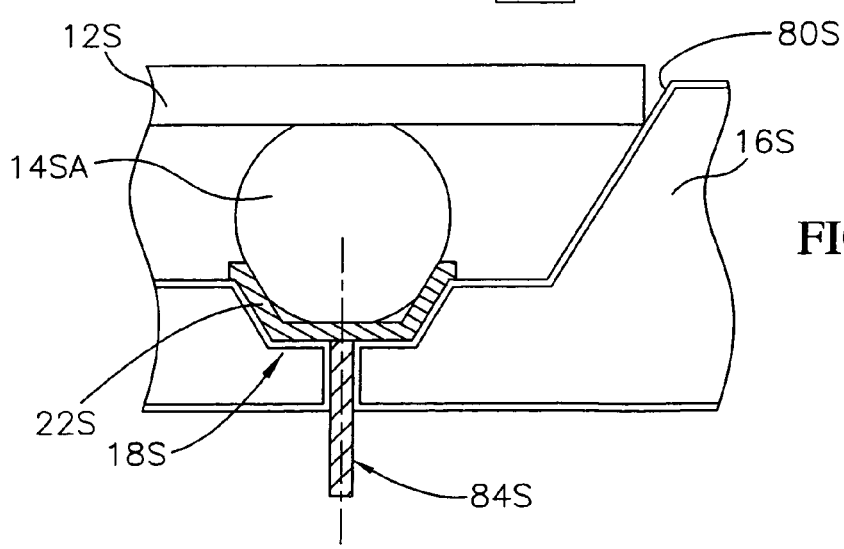
FIG. 10C is an enlarged schematic cross sectional view illustrating a separating step using the socket interconnect.

Referring to FIGS. 10A-10C, a method for testing the semiconductor component 12S using the socket interconnect 16S is illustrated. FIG. 10A illustrates the alignment and bonding steps of the method. FIG. 10B illustrates the testing step of the method. FIG. 10C illustrates the separating step of the method.

In FIG. 10A, the semiconductor component 12S is placed on the alignment member 80S of the socket interconnect 16S using a suitable placement mechanism, such as a pick and place mechanism. The alignment member 80S physically engages the peripheral edges of the semiconductor component 12S, and aligns the component contacts 14S to the interconnect contacts 18S. The aligned component contacts 14S drop into the interconnect contacts 18S, and are physically retained by the size and shape of the interconnect contacts 18S.

As also shown in FIG. 10A, a heating element 92S physically engages the component 12S, and heats the component contacts 14S and the interconnect contacts 18S. The heating element 92S can comprise a thermode, or other heating mechanism known in the art. In addition, the heating element 92S can be incorporated into the placement mechanism which places the component 12S on the interconnect socket 16S. Heating can be performed to a temperature and for a time period selected to metallurgically bond the solder wettable outer layers 20S of the interconnect contacts 18S to the component contacts 14S, substantially as previously described for the solder wettable outer layers 20 (FIG. 5A) and the component contacts 14 (FIG. 5A). The bonding step forms bonded electrical connections 66S (FIG. 10A), and a bonded assembly 68S (FIG. 10A) in which the component 12S is bonded to the socket interconnect 16S, substantially as previously described for bonded assembly 68 (FIG. 5B).

As shown in FIG. 10B, during the testing step the bonded assembly 68S is placed on a burn-in board 50S in electrical communication with a testing circuitry 52S. A suitable automated mechanism such as a test handler can be used to place the bonded assembly 68S on the burn-in board 50S. In addition, the burn-in board 50S can include electrical connections 94S, which electrically engage the terminal contacts 84S on the socket interconnect 16S, and place the interconnect contacts 18S in electrical communication with the testing circuitry 52S.

Also during the testing step, the burn-in board 50S can be placed in a burn-in oven 72 (FIG. 7) configured to heat the component 12S to a selected temperature. Test signals can then be applied to the integrated circuits 26 (FIG. 5A) on the component 12S. During the testing step, the bonded electrical connections 66S provide low resistance electrical connections for applying the test signals. In addition, there is no requirement for externally generated biasing forces to maintain the bonded electrical connections 66S. Further, the bonded electrical connections 66S have an adhesive force sufficient to resist movement and handling during testing.

As shown in FIG. 10C, the separating step can be performed using a heating system 74 (FIG. 7), such as a reflow oven, configured to heat the bonded connections 66S (FIG. 10B) to a temperature, and for a time period sufficient to alloy the solder-wettable outer layers 20S (FIG. 10B) of the interconnect contacts 18S into the component contacts 14S. During the separating step the solder-wettable outer layers 20S (FIG. 10B) dissolve as the solder-wettable metal is drawn completely into the metal of the component contacts 14S. The component contacts 14S thus include a base metal, and the solder-wettable metal alloyed into the base metal. In FIG. 10C, the alloyed component contacts are designated with reference numeral 14SA. The parameters of the separating step (e.g., time, temperature) are dependent on the materials used for the component contacts 14S and the interconnect contacts 18S.

As previously described, the alloyed component contacts 14SA (FIG. 10C) do not adhere to the non-wettable inner layers 22S (FIG. 10C). This allows the component 12S to be separated from the socket interconnect 16S using a suitable tool, such as a vacuum pick up device. The interconnect contacts 18S can then be recoated with solder-wettable outer layers 20S (FIG. 10B) substantially as previously described. In addition, the socket interconnect 16S can be reused for testing a second component substantially similar to the component 12S.

Thus the invention provides a method, an interconnect and a system for testing multiple semiconductor components on a substrate. The invention also provides a method, an interconnect and a system for testing a singulated semiconductor component. While the invention has been described with reference to certain preferred embodiments, as will be apparent to those skilled in the art, certain changes and modifications can be made without departing from the scope of the invention as defined by the following claims.

What is claimed is:

1. A method for testing a semiconductor component comprising:
   providing the component on a substrate comprising a plurality of components having a plurality of component contacts;
   providing an interconnect configured to electrically engage the component on the substrate at a wafer level, the interconnect comprising a plurality of interconnect contacts comprising first metal layers wettable with the component contacts on second metal layers non-wettable with the component contacts;
   bonding the interconnect contacts to the component contacts on the component on the substrate at the wafer level;
   applying test signals through the interconnect contacts on the component to the component on the substrate at the wafer level;
   heating the interconnect contacts and the component contacts to alloy the second metal layers into the component contacts at the wafer level; and
   separating the component contacts from the interconnect contacts with the first metal layers on the interconnect contacts in contact with the component contacts.

2. The method of claim 1 further comprising following the separating step, recoating the interconnect contacts with second outer layers.

3. The method of claim 1 wherein the bonding step comprises metallurgical bonding.

4. The method of claim 1 wherein the bonding step comprises thermocompression bonding.

5. The method of claim 1 wherein the first metal layers comprise a metal selected from the group consisting of palladium, silver, nickel, copper, gold, platinum, tin, zinc and alloys of these metals, which during the heating step dissolves into the component contacts.

6. The method of claim 1 wherein the second metal layers comprise a metal selected from the group consisting of aluminum and titanium, which during the separating step provide non adherence with the component contacts.

7. A method for testing semiconductor components comprising:
   providing a substrate comprising a plurality of semiconductor components comprising a plurality of component contacts;
   providing an interconnect comprising a plurality of interconnect contacts comprising outer metal layers wettable with the component contacts and inner metal layers non-wettable with the component contacts;
   bonding the interconnect contacts to the component contacts;
   testing the components by applying test signals through the interconnect contacts to the components;
   heating the interconnect contacts and the component contacts to dissolve the outer metal layers into the component contacts; and
   separating the component contacts from the interconnect contacts with the inner metal layers in contact with the component contacts,
   wherein the substrate comprises a semiconductor wafer or portion thereof, the components comprise semiconductor dice or packages and the method is performed with the substrate at a wafer level.

8. The method of claim 7 further comprising following the separating step recoating the interconnect contacts with second outer metal layers and reusing the interconnect.

9. The method of claim 7 wherein during the separating step the inner metal layers provide non adherence with the component contacts.

10. The method of claim 7 wherein the heating step is performed at a temperature and for a time period sufficient to alloy the outer metal layers into the component contacts.

11. The method of claim 7 further comprising following the separating step reusing the interconnect to test a second substrate comprising a plurality of second semiconductor components.

12. The method of claim 7 further comprising heating the components during the testing step.

13. The method of claim 7 wherein the bonding step comprises metallurgical bonding.

14. The method of claim 7 wherein the bonding step comprises thermocompression bonding.

15. The method of claim 7 wherein the bonding step comprises reflowing the component contacts onto the interconnect contacts.

16. The method of claim 7 wherein the first metal layers comprise a metal selected from the group consisting of palladium, silver, nickel, copper, gold, platinum, tin, zinc and alloys of these metals, and the second metal layers comprise a metal selected from the group consisting of aluminum and titanium.

17. A method for testing a semiconductor component comprising:
   providing the component on a substrate comprising a plurality of semiconductor components comprising a plurality of component contacts;

providing an interconnect configured to electrically engage the component on the substrate at a wafer level, the interconnect comprising a plurality of interconnect contacts having outer metal layers wettable with the component contacts on inner metal layers non-wettable with the component contacts;

forming a plurality of bonded electrical connections between the component contacts and the interconnect contacts at the wafer level with the component on the substrate;

testing the component by applying test signals through the electrical connections at the wafer level with the component on the substrate;

heating the electrical connections to a temperature and for a time period sufficient to at least partially dissolve the outer metal layers into the component contacts at the wafer level with the component on the substrate; and separating the interconnect from the substrate with the inner metal layers providing non adherence between the interconnect contacts and the component contacts.

18. The method of claim 17 further comprising heating the substrate and the interconnect during the testing step.

19. The method of claim 17 wherein the component comprises a die or a package and the substrate comprises a semiconductor wafer or portion thereof.

20. The method of claim 17 wherein the interconnect comprises an electrical connector in electrical communication with the interconnect contacts and a testing circuitry configured to apply the test signals.

21. The method of claim 17 further comprising recoating the interconnect contacts with second outer metal layers and reusing the interconnect to test second semiconductor components on a second substrate.

22. The method of claim 17 wherein the temperature and the time period are selected to alloy the outer metal layers into the component contacts.

23. The method of claim 17 wherein the forming step is performed using an oven.

24. The method of claim 17 wherein the forming step is performed using an aligner bonder.

25. A method for testing semiconductor components comprising:

providing an interconnect comprising a plurality of interconnect contacts;

providing a substrate comprising a plurality of semiconductor components comprising a plurality of component contacts having outer metal layers wettable with the interconnect contacts on inner metal layers non-wettable with the interconnect contacts;

forming a plurality of bonded electrical connections between the component contacts and the interconnect contacts;

testing the components by applying test signals through the electrical connections;

heating the electrical connections to a temperature and for a time period sufficient to at least partially dissolve the outer metal layers into the interconnect contacts; and separating the interconnect from the substrate with the inner metal layers providing non adherence between the component contacts and the interconnect contacts.

26. The method of claim 25 wherein the forming step comprises thermocompression bonding.

27. The method of claim 25 wherein the temperature and the time period are selected to alloy the outer metal layers into the interconnect contacts.

28. The method of claim 25 wherein the outer metal layers comprise a metal selected from the group consisting of palladium, silver, nickel, copper, gold, platinum, tin, zinc and alloys of these metals, which during the heating step dissolves into the interconnect contacts.

29. The method of claim 25 wherein the outer metal layers comprise a metal selected from the group consisting of aluminum and titanium, which during the separating step provide non adherence with the component contacts.

30. The method of claim 25 further comprising recoating the component contacts with second outer metal layers.

* * * * *